United States Patent [19]

Copeland, III

[11] 4,399,448

[45] Aug. 16, 1983

[54] HIGH SENSITIVITY PHOTON FEEDBACK PHOTODETECTORS

[75] Inventor: John A. Copeland, III, Fair Haven, N.J.

[73] Assignee: Bell Telephone Laboratories, Incorporated, Murray Hill, N.J.

[21] Appl. No.: 230,873

[22] Filed: Feb. 2, 1981

[51] Int. Cl.³ .................. H01L 29/161; H01L 33/00; H01L 27/14

[52] U.S. Cl. ........................................ 357/19; 357/16; 357/17; 357/30

[58] Field of Search ...................... 357/30, 13, 16, 17, 357/71, 19

[56] References Cited

U.S. PATENT DOCUMENTS

| | | | |
|---|---|---|---|
| 3,278,814 | 10/1966 | Rutz | 357/19 OR |
| 3,369,132 | 2/1968 | Fang et al. | 307/299 OR |
| 3,369,133 | 2/1968 | Rutz | 307/299 OR |
| 3,891,993 | 6/1975 | Beneking | 357/19 X |
| 3,990,101 | 11/1976 | Ettenberg et al. | 357/16 X |
| 4,286,277 | 8/1981 | Longshore | 357/71 X |
| 4,332,974 | 6/1982 | Fraas | 357/30 X |

OTHER PUBLICATIONS

J. M. Woodall and D. Shang, "Differential Phototransducer", *IBM Technical Disclosure Bulletin*, vol. 12, No. 9 (1970) p. 1486.

Primary Examiner—James W. Davie
Assistant Examiner—J. Carroll
Attorney, Agent, or Firm—Gregory C. Ranieri

[57] ABSTRACT

Large current gains and high degrees of sensitivity to impinging primary photons are realized in photon feedback photodetectors embodying the invention. A photocurrent generated by an internal photodiode (10, 11) in response to the primary photons (6) causes secondary photons to be emitted by internal serially connected luminescence diodes (12, 13; 14, 15). Secondary photons traveling away from the photodiode are redirected by a reflector (16) to impinge on the photodiode and thereby sustain the photocurrent. Gains of the order of 100 are realized by these photodetectors.

8 Claims, 4 Drawing Figures

HIGH SENSITIVITY PHOTON FEEDBACK PHOTODETECTORS

TECHNICAL FIELD

This invention relates to photodetectors and, more particularly, to devices comprising at least one internal radiation source.

BACKGROUND OF THE INVENTION

Optical fiber communication systems transmit and receive electromagnetic radiation at relatively low levels. As a result, detection is accomplished in these systems by using photodetection devices which exhibt a high degree of sensitivity to the received radiation levels. High degrees of sensitivity are achieved by incorporating amplification features such as avalanche multiplication, transistor action or photon feedback into the electronic design of the device.

Photon feedback is an internal amplification process in which charge carriers are multiplied in a photodetection device having two distinct semiconductor regions of dissimilar energy bandgaps. See, for example, U.S. Pat. No. 3,891,993 issued to H. Beneking on June 24, 1975. Primary photons impinging on a semiconductor region having a narrow bandgap cause charge carriers, i.e., electron-hole pairs, to be formed. Under the force of an electric field, these charge carriers are swept into the semiconductor region having a wide bandgap and undergo radiative recombination. In turn, secondary photons created by recombination impinge on the narrow bandgap semiconductor region to produce more charge carriers thereby achieving current amplification.

Multiplication of charge carriers is affected by the number of secondary photons which are fed back to the narrow bandgap semiconductor region. On the average, only one-half of the photons produced by radiative recombination in the wide bandgap semiconductor region propagate in the direction of the narrow bandgap region. Thus, charge carrier multiplication and current gain are limited to be no greater than two in presently known photon feedback devices.

Although a gain of two may be considered sufficient in some applications, current gains greater than two are needed to increase the sensitivity of photodetection devices appreciably for optical fiber communication system applications.

SUMMARY OF THE INVENTION

Increased current gain with a corresponding increase of sensitivity is realized in a photon feedback photodetector by applying a layer of reflective coating material to the external surface of a wide bandgap semiconductor region which is opposite (i.e., non-adjacent) a narrow bandgap semiconductor region. Secondary photons formed in the wide bandgap region by radiative recombination and propagating away from the small bandgap region are advantageously redirected at the reflective layer toward the narrow bandgap region. Based upon the reflectance of the reflective layer, the emission efficiency of the wide bandgap region and the absorption efficiency of the narrow bandgap region, current gain and sensitivity attainable in accordance with the present invention are two orders of magnitude greater than those of known photon feedback photodetection devices.

In one embodiment of the invention, the photodetector has four abutting semiconductor layers arranged into a sequence of pairs of layers. The device exhibits the following structure: $\underline{n}$ p p n r (or p $\underline{n}$ n p r), wherein the underscore indicates a narrow bandgap layer, no underscore indicates a wide bandgap layer and r is the reflective layer. This semiconductor structure is a floating base arrangement in which a single voltage source reverse biases the narrow bandgap region and forward biases the wide bandgap region. Primary photons generated externally to the photodetector initially impinge on the reverse biased narrow bandgap region. Absorption of the photons cause electron-hole pairs to be formed. Under the influence of the applied electric field, charge carriers are injected into the forward biased wide bandgap region wherein radiative recombination occurs. Some secondary photons released by recombination propagate toward the narrow bandgap region. Other secondary photons propagating away from the narrow bandgap region are redirected by the reflective layer toward the narrow bandgap region. Absorption of the secondary photons causes additional charge carriers to be generated. Since the emission and absorption efficiencies of the semiconductor regions are close to unity, variation of the reflectance for the reflective layer changes the current gain of the device. Gains on the order of 100 have been obtained by these devices.

In another embodiment of the invention, a second wide bandgap region (pn) abuts the narrow bandgap region to form a six-layer photon feedback photodetector. The second wide bandgap region is forward biased and therefore acts in the same fashion as the first wide bandgap region described above. Both wide bandgap regions included in this embodiment generate photons via radiative recombination in response to photocurrent charge carriers. Gain factors similar to those described above are attainable by this photodetector.

BRIEF DESCRIPTION OF THE DRAWINGS

A more complete understanding of the invention may be obtained by reading the following description of specific illustrative embodiments of the invention in conjunction with the appended drawings in which.

DETAILED DESCRIPTION

Figure 1:
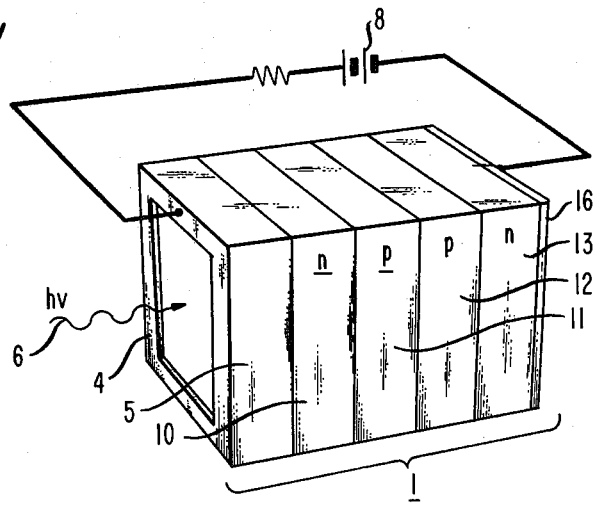
FIG. 1 is a simplified diagram of an integrated four layer photon feedback photodetector having one reflective surface.
Figure 3:
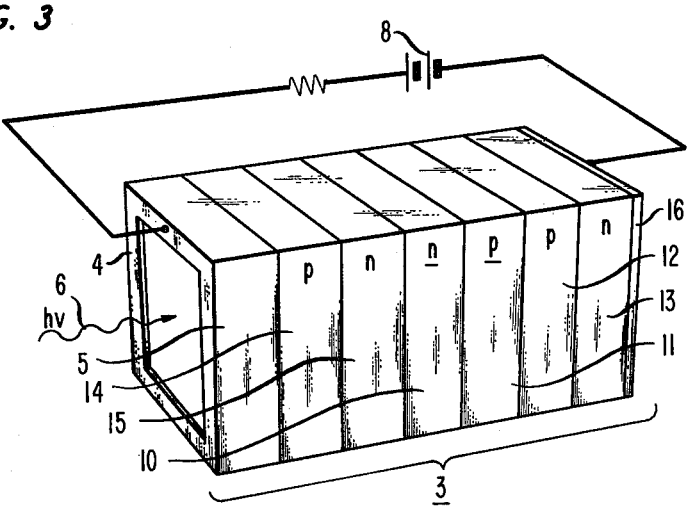
FIG. 3 is a simplified diagram of an integrated six layer photon feedback photodetector having a reflective surface.
Figure 4:
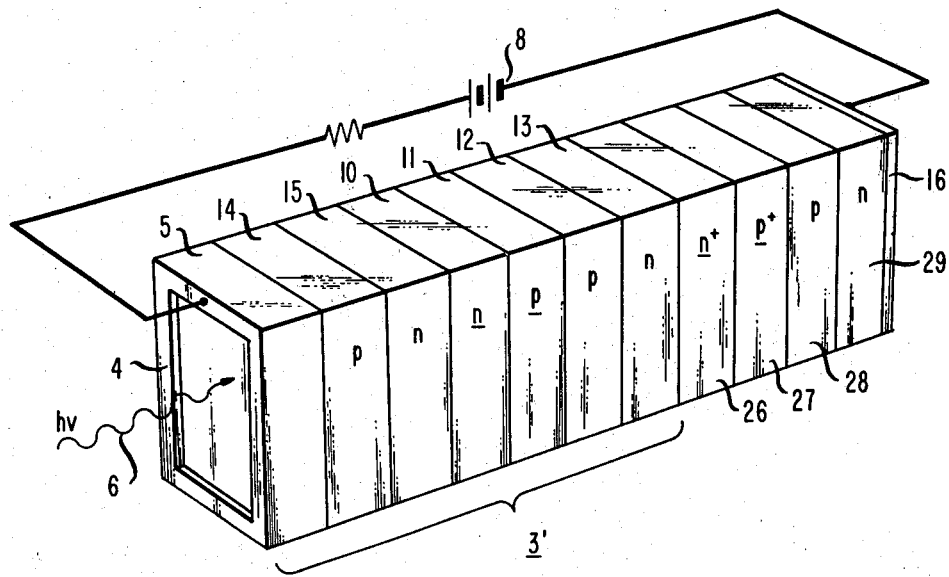
FIG. 4 is a simplified diagram of the photodetector in FIG. 3 extended to include an additional internal photon source.

Each photon feedback photodetector illustrated in FIGS. 1, 3 and 4 comprises at least four abutting layers of semiconductor material. Plane parallel junctions are formed at each interface between two abutting layers. The layers are grouped into a sequence of pairs or regions of layers. Each pair includes a layer of p-type conductivity and a layer of n-type conductivity.

Chemical composition of each layer in a particular region of the photon feedback photodetectors determines the bandgap for the region, the suitability of the region for photon absorption or photon emission as well as the respective absorption or emission efficiencies among others. Semiconductor compounds in the photon feedback photodetectors embodying the invention are highly efficient with regard to both photon absorption ($n_a=1$) in a reverse biased narrow bandgap region and photon emission ($n_e=1$) in a forward biased wide bandgap region.

The compounds chosen for each region of the photodetectors are commonly known as III–V compounds. Each wide bandgap region, identified in FIGS. 1, 3 and 4 as a pn junction (no underscore) is composed of a quarternary compound such as indium gallium arsenide phosphide ($In_xGa_{1-x}As_yP_{1-y}$). A ternary compound such as indium gallium arsenide ($In_xGa_{1-x}As$) is employed in each narrow bandgap region identified as a p$\underline{n}$ junction.

A substrate material upon which successive p and n layers are epitaxially grown is also selected from the class of III–V compounds. Impurities are introduced into the substrate to cause the conductivity type of the substrate to match the conductivity type of the abutting layer in an immediately adjacent region. Indium phosphide (InP) is used as a substrate in these photodetectors because it is substantially transparent to electromagnetic radiation in the range of interest for optical fiber transmission systems, i.e., approximately 1.3 microns (0.954ev.). That is, the energy bandgap of the substrate material is larger than the energy of the primary photons to be detected.

The energy bandgap is measured in electron-volts (ev) and represents the width of the forbidden region in the band model for semiconductors. This width is measured from an upper potential limit of the valence band to a lower potential limit of the conduction band. In the particular embodiment of the invention shown in the attached figures, the bandgap for each region is as follows:

| substrate | InP | ~1.28 ev. |
|---|---|---|
| pn region | InGaAsP | ~1.03 ev. |
| p$\underline{n}$ region | InGaAs | ~0.78 ev. |

Each pn junction is a homojunction whether it is in a wide or narrow bandgap region. Each junction between layers of like conductivity in adjacent regions, i.e., n$\underline{n}$ or p$\underline{p}$, is a heterojunction. Usually, the lattices of two abutting semiconductor materials are matched at the heterojunction to provide a capability for photon emission or absorption near the heterojunction. In the photodetectors embodying the invention, photon emissions and absorptions occur near the pn homojunctions and not near the heterojunctions. The n$\underline{n}$ or p$\underline{p}$ heterojunctions primarily facilitate electrical (ohmic) contact between the abutting layers of similar conductivity type. Thus, it is unnecessary to lattice match the materials at each heterojunction in the present photodetectors.

Thickness of each layer is important, particularly in the narrow bandgap region. Each layer is thin enough to be depleted by the applied bias thereby ensuring that charge carriers generated by photon absorption in a narrow bandgap layer reach the side of the junction on which they are majority carriers. The depletion width in each pn junction depends upon the impurity concentrations of both layers and upon the applied voltage. For example, an InGaAs p$\underline{n}$ junction subject to a reverse bias of 10 volts exhibits a depletion width of approximately 4.2 microns: the $\underline{n}$ layer is depleted by 3.8 microns; the $\underline{p}$ layer is depleted by 0.4 microns. Thus, narrow bandgap regions for photodetectors designed in accordance with the invention have a $\underline{p}$ layer which is approximately 0.3 microns thick and an $\underline{n}$ layer which is approximately 3.7 microns thick.

For wide bandgap regions, the layer thickness is substantially equal to four or more diffusion lengths for minority carriers in the particular layer. This ensures radiative recombination of injected minority carriers before the carriers diffuse to an interface with an adjacent layer. Impurity concentrations are increased in each layer to keep each layer thickness within reasonable limits. A large impurity concentration yields diffusion lengths of 0.2 microns for holes in p-type material and approximately 1.0 microns for electrons in n-type material. Hence, wide bandgap regions designed in accordance with the invention exhibit layer thickness of 0.8 microns for each p layer and 4.0 microns for each n layer.

Turning now to the photodetector embodiments in the individual figures, FIG. 1 is a simplified diagram of integrated four layer photon feedback photodetector 1. Photodetector 1 comprises a sequence of two pairs of layers of semiconductor material epitaxially grown on substrate 5 and coated with reflective material to form reflector 16.

Each pair of layers forms a pn homojunction with either a wide or narrow energy bandgap; $\underline{n}$ layer 10 and $\underline{p}$ layer 11 combine as a narrow bandgap pair (indicated by underscore), and p layer 12 and n layer 13 combine as a wide bandgap pair. A heterojunction is formed between each pair of layers. In photodectector 1, the heterojunction exists between p layer 11 and p layer 12. The heterojunction merely provides ohmic contact between the abutting pairs of layers.

The device shown in FIG. 1 is represented conceptually as a photodiode (layers 10 and 11) in series with a luminescence diode (layers 12 and 13). Each diode must be properly biased in order for the entire photodetector device to operate properly. To operate as intended, the photodiode must be reverse biased and the luminescence diode must be forward biased. Proper biasing is facilitated by the serial arrangement of diodes. In fact, a single voltage source such as bias voltage source 8 attached across photodetector 1 achieves a proper bias condition for the photodetector.

The bias voltage is determined to provide the desired amplification of photon feedback photodetector 1. In the embodiment shown in FIG. 1, bias voltage source 8 generates an output voltage in the range of 5 to 10 volts. Bias voltage source 8 is connected in series with a load resistor as shown in FIG. 1. The load resistor is also connected to electrode 4 on substrate 5. Another electrode is provided on reflector 16 to which bias voltage source 8 is connected. This electrode need not have a gap or window in it as does electrode 4.

Reflector 16 is a metallic reflective coating, such as gold or a combination of titanium and gold, applied to the entire outermost surface of n layer 13 furthest from substrate 5. When the combination of titanium and gold is employed, a layer of titanium abuts the outermost surface of n layer 13. A layer of gold is then bonded directly to the outermost surface of the titanium layer.

Primary photon 6 impinges on substrate 5 via a gap or window in electrode 4. Since substrate 5 is transparent to photon 6, photon 6 passes through substrate 5 substantially unhindered. Primary photon 6 is then absorbed in the depleted narrow bandgap region: $\underline{n}$ layer 10 or p layer 11. n layer 10 is made thin enough to allow photocurrent charge carriers generated by the absorption of photon 6 to be carried by the junction electric field to p layer 11.

As the photocurrent begins to flow, the forward biased junction between p layer 12 and n layer 13 experiences a potential increase. This increase causes free electrons and injected holes to recombine radiatively near the forward biased junction. Secondary photons generated by the radiative recombination are emitted in all directions. Reflector 16 provides a means for redirecting some secondary photons back toward p layer 11 for subsequent absorption. Those secondary photons initially directed toward p layer 11 continue in that direction until they are absorbed. Thus, substantially all of the secondary photons generated by radiative recombination in p layer 12 or n layer 13 are collected in p layer 11 to create additional charge carrier pairs and sustain the photocurrent. The number of additional charge carrier pair determines the gain and sensitivity of photodetector 1.

Current gain is defined as a ratio of the number of charge carriers crossing a particular cross section of photodetector 1 to the number of primary photons (photon 6) absorbed by photodetector 1. Simplification of this ratio using a standard technique allows the gain factor to be calculated as, $$G = (1 - 0.5(1+R)n_e n_a)^{-1}$$

where R is the reflectance of reflector 16, $n_a$ is the photon absorption efficiency of n layer 10 and p layer 11, and $n_e$ is the photon emission efficiency of p layer 12 and n layer 13. For the photodetectors shown in FIGS. 1, 3 and 4, both $n_e$ and $n_a$ are substantially equal to unity. It is appreciated that, by properly selecting materials which exhibit very high values for $n_e$, $n_a$, and R, a gain factor of 100 or more is easily obtained.

Photodetector devices of the type shown in FIG. 1 have been fabricated using epitaxial growth techniques. Liquid phase epitaxy has been predominantly used, but molecular beam epitaxy is also applicable. These techniques yield devices which are about 100 microns square. The thickness of photodetector 1 is substantially equal to the number of pn and pn junctions times approximately 5 microns plus the substrate thickness. Typical substrate thicknesses are on the order of 75 microns. Hence, the thickness of photodetector 1 is slightly greater than 87 microns.

During epitaxial growth of the devices, impurities are introduced into each layer. The type of impurity and the concentration of the impurity affect the conductivity of each layer. Impurity types and impurity concentrations for the various layers of an exemplary embodiment of photodetector 1 are tabulated below:

| LAYER | COMPOSITION | IMPURITY | IMPURITY CONCENTRATION (Atoms/cm)$^3$ |
|---|---|---|---|
| n:5 | InP | Tin | $10^{18}$ |
| n:10 | $In_{0.53}Ga_{0.47}As$ | Tin | $10^{15}$ |
| p:11 | $In_{0.53}Ga_{0.47}As$ | Zinc | $10^{17}$ |
| p:12 | $In_{0.79}Ga_{0.21}As_{0.46}P_{0.54}$ | Zinc | $10^{17}$ |
| n:13 | $In_{0.79}Ga_{0.21}As_{0.46}P_{0.54}$ | Tin | $10^{17}$ |

Figure 2:
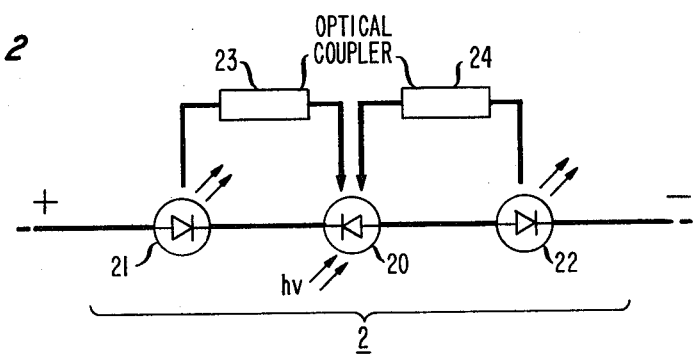
FIG. 2 is a schematic diagram of a distributed photon feedback photodetector having two luminescence diodes optically and ohmically connected to a simple photodiode.

The arrangement shown in FIG. 2 is a distributed photon feedback photodetector having two luminescence diodes optically and ohmically connected in a serial circuit to a photodiode. In a broad sense, this arrangement is an extension of the concept embodied by photodetector 1 in FIG. 1. Photodetector 2 not only includes the photodiode and luminescence diode described in relation to photodetector 1, but also incorporates an additional luminescence diode. The second luminescence diode provides another means for increasing the sensitivity and current gain of the photodector device.

Photodetector 2 comprises a series connected circuit including photodiode 20 and luminescence diodes 21 and 22. Biasing voltage for photodetector 2 is provided by a voltage source in series with a load resistor such as is shown in FIG. 1. The polarity of the biasing voltage is illustrated by the presence of a positive sign and a negative sign in FIG. 2.

Primary photons hv are incident only on photodiode 20 of photodetector 2. As primary photons hv are collected by photodiode 20, a photocurrent begins to flow through diodes 21 and 22. Based on the magnitude of the photocurrent and the quantum efficiencies of diodes 21 ($Q_{D21}$) and 22 ($Q_{D22}$), secondary photons will be emitted by each of the luminescence diodes. It is important to isolate luminescence diodes 21 and 22 from the primary photons because irradiation of diodes 21 and 22 causes a photovoltage to be generated in opposition to the desired signal.

Since photodetector 2 is a distributed arrangement, proxmity of the luminescence diodes to the photodiode is not a sufficient condition to effect efficient photon feedback. Photon feedback paths are realized by attaching optical couplers from each luminescence diode to the photodiode. To this end, optical coupler 23 establishes a feedback path for secondary photons emitted from diode 21 to photodiode 20; optical coupler 24 establishes a similar feedback path for secondary photons emitted from diode 22 to photodiode 20. Optical fibers and lenses have been employed as optical couplers.

Current gain G of an arrangement such as photodetector 2 is approximately determined as, $$G = (1 - (Q_{D21} + Q_{D22}))^{-1}$$

where $Q_D$ is the quantum efficiency for each particular luminescence diode. Other factors tending to influence the sensitivity of photodetector 2 are the efficiency of optical couplers 23 and 24 and the ability of each coupler to collect the secondary photons emitted by the corresponding luminescence diode.

FIG. 3 is a simplified diagram of an integrated six-layer photon feedback photodetector including a reflective surface. Photodetector 3 includes not only the four abutting semiconductor layers of photodector 1 from FIG. 1, but also two additional semiconductor layers: namely, p layer 14 and n layer 15. Layers 14 and 15 form a wide bandgap region. It should be noted that, in photodetector 3, substrate 5 has a conductivity type of p+ which is similar to the conductivity of abutting p layer 14.

Primary photon 6 is incident on substrate 5 of photodetector 3 via the gap or window in electrode 4. Since substrate 5 is transparent to photon 6 because of its wide bandgap, photon 6 passes through substrate 5 substantially unhindered. p layer 14 and n layer 15 also have sufficiently wide bandgaps to permit the unhindered passage of photon 6 to n layer 10. In n layer 10, photon 6 is absorbed causing a photocurrent to flow. Radiative recombination of the photocurrent charge carriers occurs in the two wide bandgap regions containing layers 12 and 13 and layers 14 and 15. Secondary photons generated in layers 12 and 13 are either directed toward p layer 11 initially or reflected via reflector 16 toward p layer 11. On the average, half of the secondary photons generated in layers 14 and 15 are directed toward n layer 10. Absorption of the secondary photons occurs in the narrow bandgap region comprising layers 10 and 11 and causes an increase in the number of photocurrent charge carriers.

In the epitaxial growth process for photodetector 3, impurities are introduced into p layer 14 and n layer 15 to the same concentration levels as p layer 12 and n layer 13, respectively. The remaining layers are prepared as described above in relation to photodetector 1 in FIG. 1, except that substrate 5 is doped with zinc at an impurity concentration level of $10^{18}$ atoms/cm$^3$ to exhibit p+ conductivity.

FIG. 4 shows a photodetector comprising photodetector 3', which is substantially identical to photodetector 3, an n+ p+ region, and a third wide bandgap (photon emitting) pn region connected to photodetector 3' by the n+ p+ region. The n+ p+ region is extremely thin and has a very high impurity concentration level so that it acts substantially as ohmic contact when reverse biased.

In this photodetector device, the bandgap of the region comprising p layer 28 and n layer 29 is narrower than the bandgap of the region including layers 12 and 13. This allows layers 12 and 13 to appear transparent to secondary photons generated in either layer 28 or 29. Thus, secondary photons generated in either layer 28 or 29 have an extremely high probability of being collected in p layer 11 of the narrow bandgap region.

The photodetector in FIG. 4 responds to primary photon 6 in the same way as photodetectors 1 and 3. A photocurrent generated in the photodetector causes secondary photons to be emitted by the three photon emitting pn regions: layers 12 and 13, layers 14 and 15, and layers 28 and 29. Reflector 16 redirects secondary photons toward p layer 11. Collection of the secondary photons is performed by either n layer 10 or p layer 11. n+ layer 26 and p+ layer 27 are reverse biased to create an ohmic contact between p layer 28 and n layer 13 and are transparent to the secondary photons generated in the adjacent pn regions.

p layer 28 and n layer 29 are identical in chemical structure and impurity concentration to p layer 12 and n layer 13, respectively. Both n+ layer 26 and p+ layer 27 are extremely thin layers composed of In$_{0.57}$Ga$_{0.43}$As. Each layer in the n+ p+ region is approximately 1-2 microns thick. Layer 26 is heavily doped with sulfur to an impurity concentration of approximately $10^{18}$ atoms/cm$^3$; also, layer 27 is heavily doped with zinc to an impurity concentration of approximately $10^{18}$ atoms/cm$^3$.

All of the photon feedback photodetectors described above exhibit a high degree of sensitivity to primary photons. This sensitivity has been experimentally shown to be at least an order of magnitude improvement over prior similar devices.

Complementary structures for the photodetectors shown in FIGS. 1, 3 and 4 are obtained merely by changing the conductivity type of each layer to the opposite conductivity type and by reversing the biasing voltage polarity.

Slight modifications of the photodetectors shown in the FIGURES are within the spirit and scope of this invention for improving the presently realizable degree of sensitivity. One such modification for the photodetectors shown in FIGS. 3 and 4 is to place a dielectric reflector between electrode 4 and substrate 5 for reflecting secondary photons back toward n layer 10. Also a metallic reflector similar to reflector 16 but having the minimum size gap or window necessary to allow passage of primary photon 6 can be substituted for electrode 4.

What is claimed is:

1. An optoelectronic device comprising a substrate and at least four abutting layers of semiconductor material grouped into a sequence of pairs of layers, each pair being arranged as a first layer and a second layer, the substrate abutting one layer of the pairs of layers and being comprised of a semiconductor material having a similar conductivity type to that of the abutting layer of the pairs of layers, electrode means for applying a bias potential across the sequence of pairs of layers, the first layer of each pair being composed of semiconductor material having a conductivity type opposite to that of the second layer in the corresponding pair, the first and second layers within each pair having substantially equal bandgaps, the first layer of each pair in the sequence of pairs being comprised of similar conductivity type semiconductor material to the second layer of each immediately adjacent pair of layers, and the bandgap of the first layer of each pair being substantially dissimilar to the bandgap of the second layer of each immediately adjacent pair, characterized in that a reflective coating layer abuts an outermost layer of the sequence of pairs of layers.

2. The device as defined in claim 1 wherein the outermost layer of the sequence of pairs is a first layer of a pair of layers having a wide bandgap.

3. The combination as defined in claim 2 wherein the first layer of each pair is of substantially equal thickness to the second layer of each immediately adjacent pair of layers.

4. The device as defined in claim 2 wherein the reflective coating layer includes a first layer of titanium and a second layer of gold abutting therewith.

5. An optoelectronic comprising a substrate and at least six abutting layers of semiconductor material grouped into a sequence of pairs of layers, each pair being arranged as a first layer and a second layer, the substrate abutting one layer of the pairs of layers and being comprised of a semiconductor material having a similar conductivity type to that of the abutting layer, electrode means for applying a bias potential across the sequence of pairs of layers, the first layer of each pair being composed of semiconductor material having a conductivity type opposite to that of the second layer in the corresponding pair, the first and second layers within each pair having substantially equal bandgaps, characterized in that the first layer of each pair in the sequence of pairs is composed of similar conductivity type semiconductor material to the second layer of each immediately adjacent pair of layers, and the bandgap of the first layer of each pair is substantially dissimilar to the bandgap of the second layer of each immediately adjacent pair.

6. The device as defined in claim 5 further characterized in that,
a reflective coating layer abuts a first outermost layer of the sequence of pairs of layers.

7. The device as defined in claim 6 wherein the first outermost layer of the sequence of pairs is a first layer of a pair of layers having a wide bandgap and at a contraposition to the substrate.

8. The combination as defined in claim 7 wherein the reflective coating layer includes a first layer of titanium and a second layer of gold abutting therewith, the first layer of titanium abutting the first outermost layer.

* * * * *